United States Patent [19]

Tsujimoto

[11] Patent Number: 5,222,044
[45] Date of Patent: Jun. 22, 1993

[54] DYNAMIC RANDOM ACCESS MEMORY DEVICE EQUIPPED WITH TWO-WAY POWER VOLTAGE SUPPLYING SYSTEM

[75] Inventor: Akira Tsujimoto, Tokyo, Japan
[73] Assignee: NEC Corporation, Tokyo, Japan
[21] Appl. No.: 654,700
[22] Filed: Feb. 13, 1991
[30] Foreign Application Priority Data
   Feb. 13, 1990 [JP] Japan .................................. 2-33022
[51] Int. Cl.$^5$ ............................................ G11C 11/40
[52] U.S. Cl. ..................................... 365/226; 365/204
[58] Field of Search ............... 365/203, 204, 226, 228, 365/229

[56] References Cited

U.S. PATENT DOCUMENTS

4,583,205  4/1986  Watanabe ....................... 365/226 X
4,709,354  11/1987  Ichinose et al. ..................... 365/226

Primary Examiner—Steven Mottola
Attorney, Agent, or Firm—Sughrue, Mion, Zinn, Macpeak & Seas

[57] ABSTRACT

A random access memory device is equipped with a two-way power supplying system for distributing an external power voltage level and an internal power voltage level lower than the external power voltage level, and comprises a memory cell array associated with a plurality of bit line pairs as well as with reference voltage lines shifted to a half of the internal power voltage level, a plurality of sense amplifier circuits, a transfer gate unit coupled between the bit line pairs and the sense amplifier circuits, and a timing controlling unit for producing an activation signal fed to the sense amplifier circuits and a transfer gate controlling signal of the internal power voltage level fed to the transfer gate unit, wherein the activation signal is shifted to the external power voltage level so that the sense amplifier circuits rapidly increase small differences on the associated bit line pairs.

5 Claims, 9 Drawing Sheets

PRIOR ART

DYNAMIC RANDOM ACCESS MEMORY DEVICE EQUIPPED WITH TWO-WAY POWER VOLTAGE SUPPLYING SYSTEM

FIELD OF THE INVENTION

This invention relates to a semiconductor memory device and, more particularly, to a two-way power voltage supplying system for distributing different power voltage levels to component units incorporated in a dynamic random access memory device.

DESCRIPTION OF THE RELATED ART

Progressive development of miniaturization has increased the integration density of component circuit elements which are fabricated on a single semiconductor chip. This has a dynamic random access memory device to obtain a density of 16 megabit memory cell array. As hot carriers are likely to attack the component field effect transistors of such 16 megabit dynamic random access memory devices and, accordingly, deteriorate the transistor's characteristics thereof, it has been proposed to supply a step-down power voltage to the component electric circuits.

Figure 1:
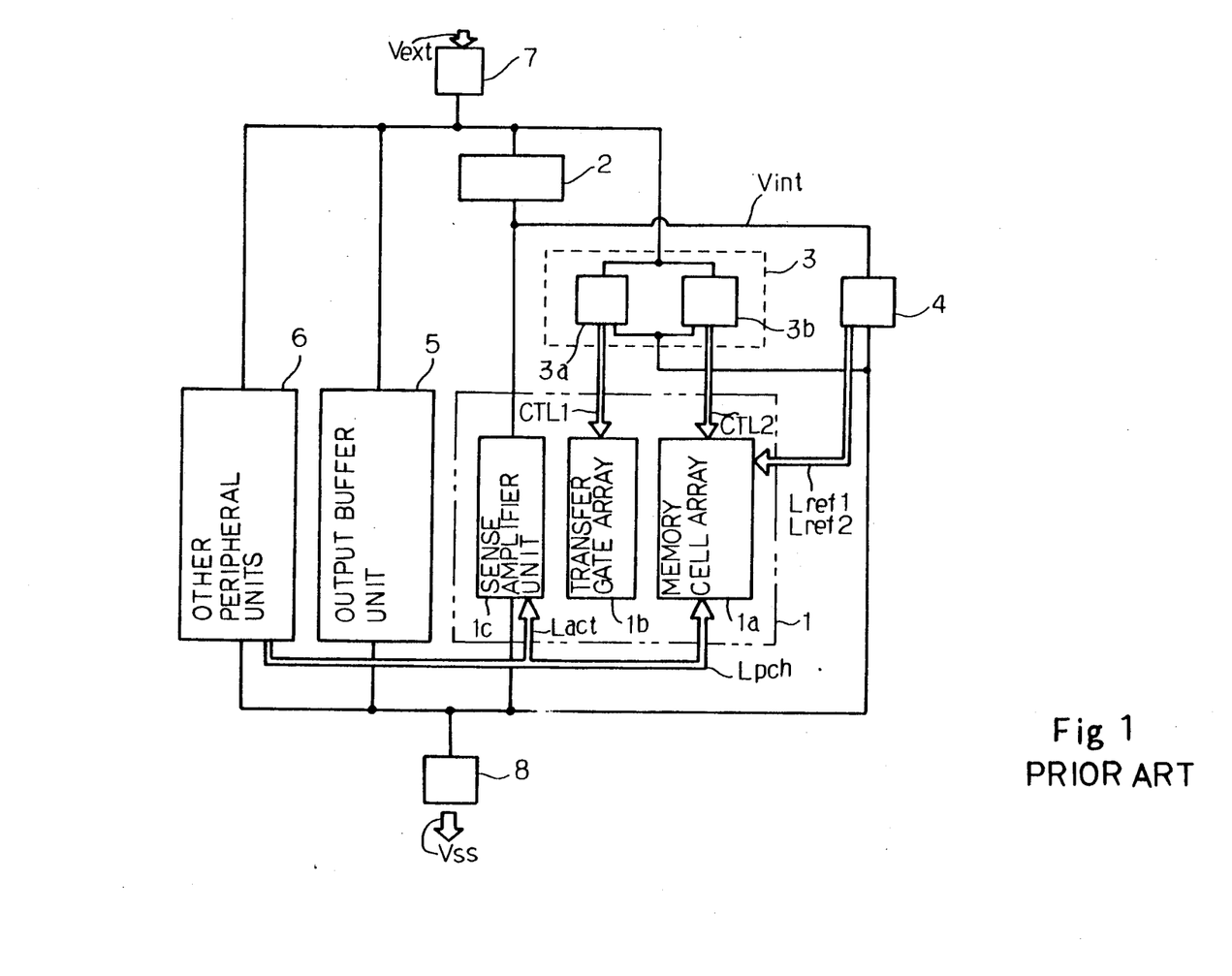
FIG. 1 is a block diagram showing the two-way power supply system incorporated in a prior art random access memory device.

FIG. 1 shows a typical example of a dynamic random access memory device equipped with an internal power supply circuit for producing a step-down power voltage, and focuses on a power voltage supplying system. The dynamic random access memory device shown in FIG. 1 comprises a memory division 1, an internal power supply unit 2, a timing controlling unit 3, a reference voltage producing unit 4, an output buffer unit 5 and other peripheral units. A memory cell array 1a, a transfer gate array 1b and a sense amplifier unit 1c are incorporated in the memory division 1.

The dynamic random access memory device is equipped with a power voltage terminal 7 and a ground voltage terminal 8, and an external power voltage Vext is supplied to the power voltage terminal 7. The ground voltage terminal 8 remains in the ground voltage level Vss. The timing controlling unit 3 includes a transfer gate controlling circuit 3a for producing a transfer gate controlling signal CTL1, and a word line driving circuit 3b for producing a multi-bit word line driving signal CTL2. Although the timing controlling unit 3 further comprises other controlling circuits so as to achieve a sequential operation on the component units 1, 5 and 6, those controlling circuits are omitted from FIG. 1, because they are less important for understanding problems inherent in the prior art dynamic random access memory device. The external power voltage Vext is directly supplied to the internal power supply unit 2, the timing controlling unit 3, the output buffer unit 5 and the other peripheral units 6. However, a step-down voltage or an internal power voltage level Vint produced by the internal power supply unit 2 is supplied to the reference voltage producing unit 4 and the sense amplifier unit 1c. Since the timing controlling unit 3 is supplied with the external power voltage Vext, the transfer gate controlling circuit 3a and the word line driving circuit 3b behaves with the external power voltage level Vext.

Figure 2:
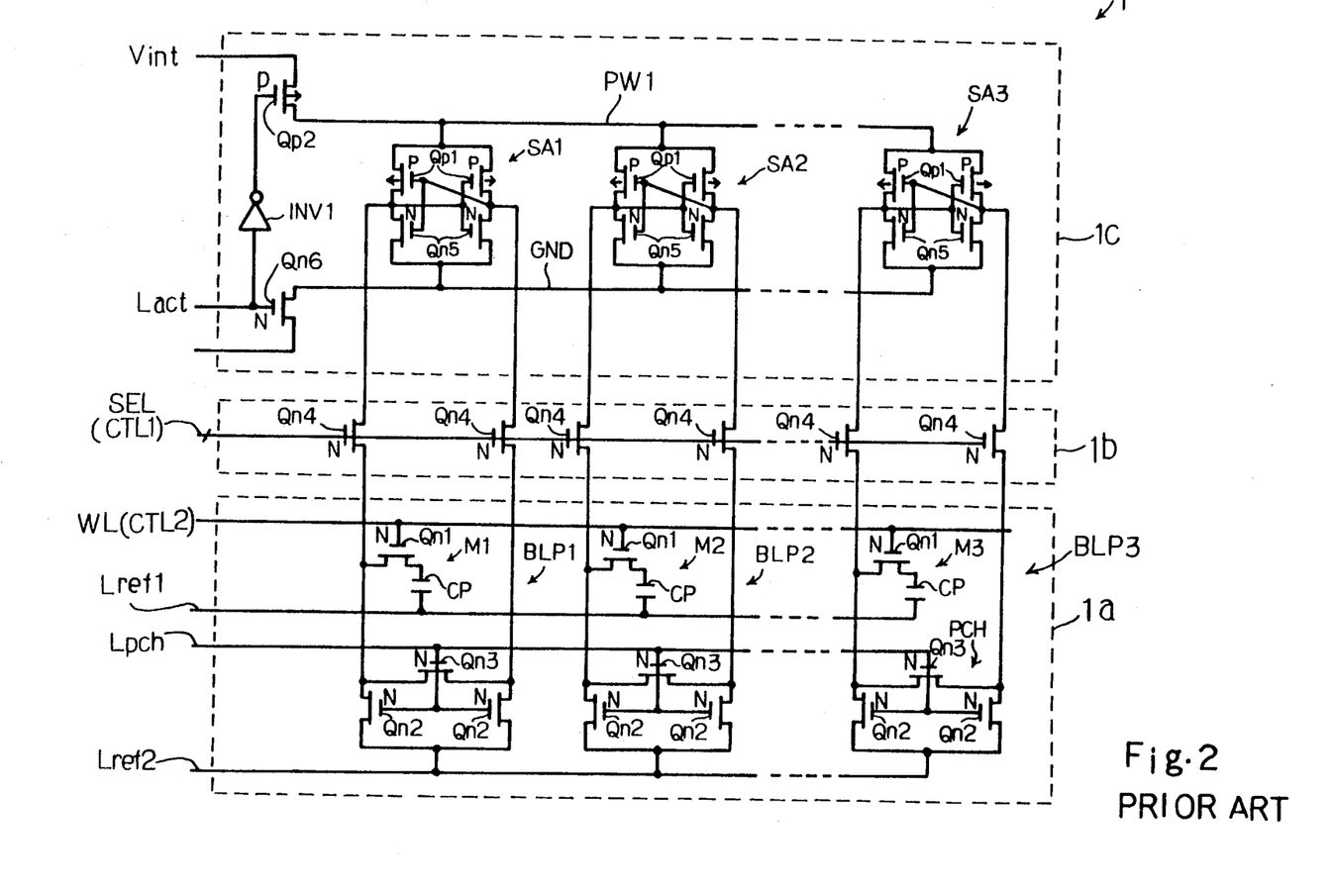
FIG. 2 is a circuit diagram showing the circuit arrangement of the prior art random access memory device.

FIG. 2 shows the circuit arrangement of the memory division 1. The memory cell array 1a includes a plurality of random access memory cells including M1, M2, and M3 and associated with a precharging circuit PCH, and each memory cell M1, M2 or M3 is implemented by a series combination of a switching transistor Qn1 and a storage capacitor CP. The switching transistor Qn1 is an n-channel type field effect transistor. A bit line pairs BLP1, BLP2 and BLP3 are provided for the memory cells M1, M2 and M3, respectively, and the series combination of the switching transistor Qn1 and the storage capacitor CP is coupled between one of the associated bit lines and a reference voltage line Lref1 coupled to the reference voltage producing unit 4. The switching transistors Qn1 are coupled at the gate electrodes thereof to a word line WL propagating a bit of the word line driving signal CTL2. The precharging circuit PCH is fabricated from charging transistors Qn2 and equalizing transistors Qn3 all of which are n-channel type field effect transistor. The charging transistors Qn2 are coupled between the bit line pairs BLP1 to BLP3 and another reference voltage line Lref2 which is coupled to the reference voltage producing unit 4. The reference voltage line Lref2 supplies a reference voltage level VR to the storage capacitors CP. The equalizing transistors Qn3 as well as the charging transistors Qn2 are coupled at the gate electrodes thereof to a control signal line Lpch, and each combination of the charging transistors Qn2 and the equalizing transistor Qn3 causes the component bit lines of the associated bit line pair to be equalized at the reference voltage level VR in the presence of a precharging signal of the external voltage level Vext on the control signal line Lpch.

The transfer gate array 1b is implemented by a plurality of gate transistors Qn4 which are n-channel type field effect transistors. The transfer gate controlling signal CTL1 is supplied through a transfer gate controlling signal line SEL to the gate electrodes of the gate transistors Qn4, and the transfer gate array 1b relays the data bits on the bit line pairs BLP1 to BLP3.

Figure 3:
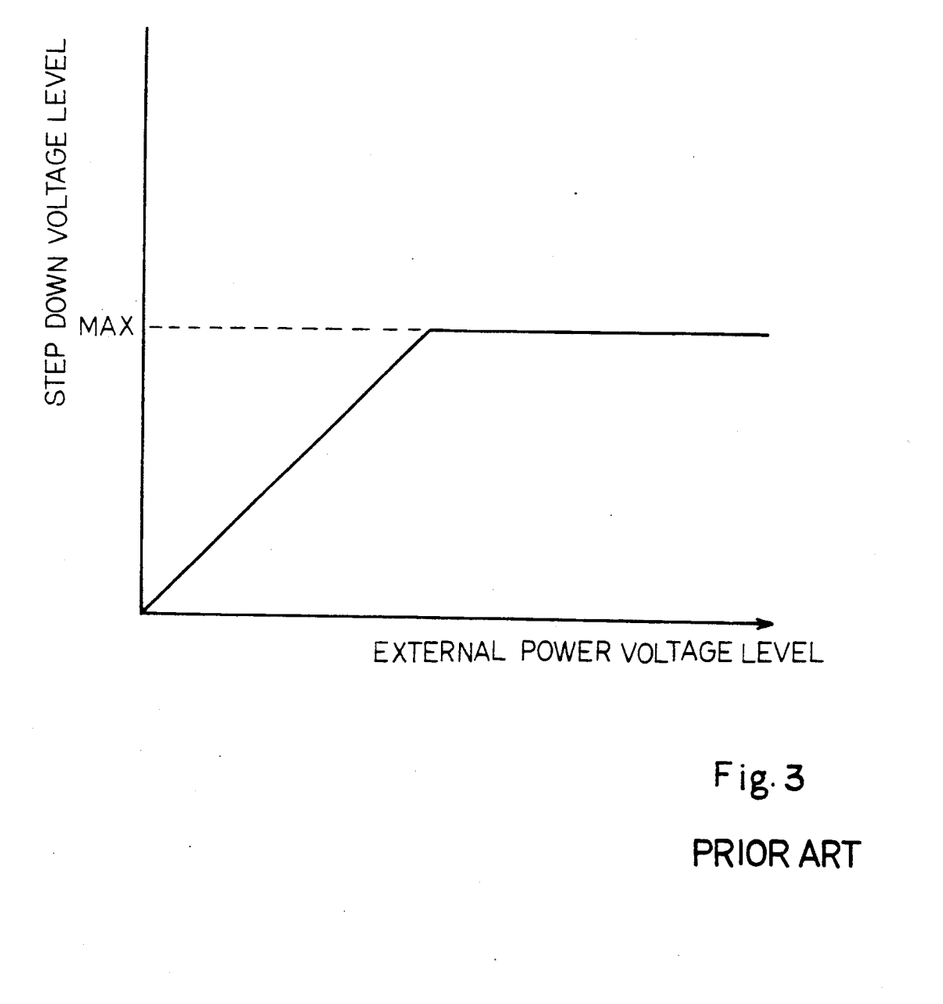
FIG. 3 is a graph showing an ideal relationship between the external power voltage level and the step-down voltage level.

The sense amplifier unit 1c includes sense amplifier circuits SA1, SA2 and SA3, and each of the sense amplifier circuits SA1 to SA3 is implemented by two series combinations of n-channel type field effect transistors Qn5 and p-channel type field effect transistors Qp1, and the two series combinations are coupled in parallel between the internal power voltage line PW1 and a ground voltage line GND. The internal power voltage line PW1 supplies the step-down voltage level Vint to the p-channel type field effect transistors Qp1, and the ground voltage line GND is coupled through a switching transistor Qn6 of the n-channel type to the ground voltage terminal 8. On the other hand, the internal power voltage line PW1 is coupled through a switching transistor of the p-channel type to the internal power supply unit 2, and an activation signal on an activation signal line Lact is supplied through an inverter circuit INV1 to the switching transistor Qp2. The activation signal is directly supplied to the switching transistor Qn6, and the switching transistors Qp2 and Qn6 are concurrently switched between on-state and off-state in response to the activation signal. In this instance, the activation signal is as high as the external power voltage level Vext. FIG. 3 shows the ideal output voltage characteristics of the internal power supply unit 2. The internal power voltage supplying unit 2 increases the output voltage level thereof or the step-down voltage level Vint together with the external power voltage level Vext, but limits the internal power voltage level Vint at the predetermined maximum value MAX ranging between 3.3 volts and 4.0 volts.

Figure 4:
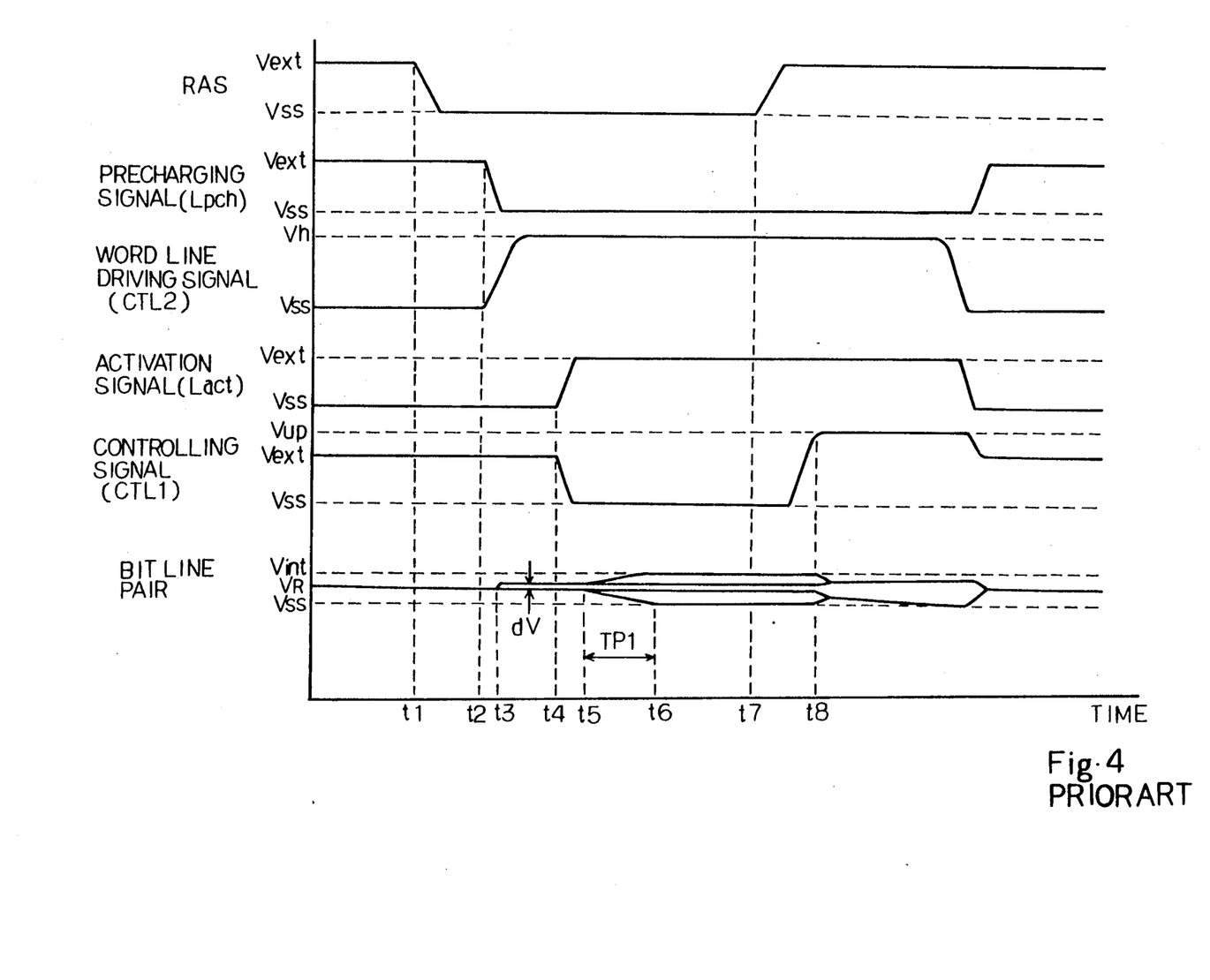
FIG. 4 is a timing chart showing the sequence of a read-out operation carried out by the prior art random access memory device.

The prior art random access memory device thus arranged behaves as follow. If a row address strobe signal RAS goes down to an active low voltage level or the ground voltage level Vss at time t1 (see FIG. 4), the precharging signal on the control signal line Lpch is recovered to the ground voltage level Vss at time t2, and the word line driving signal CTL2 allows the word line WL to exceed the external power voltage level Vext on the basis of a row address signal. The word line WL reaches a predetermined high voltage level Vh by the aid of a booster circuit incorporated in the word line controlling unit 3b. Prior to the recovery of the precharging signal, the charging transistors Qn2 charge up all of the bit line pairs BLP1 to BLP3 to the reference voltage level VR, and the equalizing transistors Qn3 each equalizes the component bit lines of the associated bit line pair. As described hereinbefore, the precharging voltage level VR is a half of the internal power voltage level Vint. The switching transistors Qn1 coupled to the word line WL concurrently turn on, the data bits memorized in the storage capacitors CP are read out to the associated bit lines, respectively.

Assuming now that the leftmost memory cell M1 is accessed and memorizes a data bit of logic "1" level, the associated bit line goes up from the reference voltage level VR at time t3, and the increment dV is given as $$dV = CS \times (Vx - VR)/(CB + CS)$$

where CS is the capacitance of the storage capacitor CP, CB is the parasitic capacitance coupled to the bit line, and Vx is the voltage level at the storage capacitor CP. A pair of the gate transistors Qn4 coupled to the bit line pair BLP1 allow the voltage level slightly incremented and the reference voltage level VR to be relayed to the leftmost sense amplifier circuit SA1. At time t4, the transfer gate controlling signal CTL1 is recovered to the ground voltage level Vss, and the gate transistors Qn4 block the sense amplifier circuit SA1 from the parasitic capacitance of the associated bit line pair BLP1. The activation signal on the signal line Lact goes up to the external voltage level Vext and activates the sense amplifier circuit SA1. The sense amplifier circuit SA1 starts to increase the small difference in voltage level on the bit line pair BLP1 at time t5, and the component bit lines of the bit line pair BLP1 reach the internal power voltage level Vint and the ground voltage level Vss, respectively, at time t6, because the sense amplifier circuit SA1 is coupled between the internal power voltage line PW1 and the ground voltage line Vss.

The row address strobe signal RAS is recovered to the inactive level or the external power voltage level Vext at time t7, and the transfer gate controlling signal CTL1 goes up again, exceeding the external power voltage level Vext. The transfer gate controlling signal CTL1 reaches a step-up voltage level Vup by the aid of the booster circuit (not shown) at time t8. Then, the gate transistors Qn4 fully turn on again, and the internal power voltage level Vint is fed back to the memory cell M1 for carrying out a refreshing operation.

However, a problem encountered in the prior art random access memory device as described above is that a high speed data access is unattainable. This is because the sense amplifier circuits SA1 to SA3 are supplied with the internal power voltage level Vint. Namely, only a small difference voltage takes place across the p-channel type field effect transistors QP1 upon activation of the sense amplifier circuits SA1 to SA3, and, accordingly, the p-channel type field effect transistors Qp1 drive the associated bit lines through a long time period TP1.

SUMMARY OF THE INVENTION

It is therefore an important object of the present invention to provide a semiconductor memory device which achieves a high speed operation.

To accomplish these objects, the present invention proposes to drive bit line pairs with an external power voltage level Vext.

In accordance with the present invention, there is provided a dynamic random access memory device fabricated on a semiconductor chip, comprising: a) a plurality of memory cells arranged in rows and columns and storing digital data bits, respectively, each of the memory cells being implemented by a series combination of a switching transistor and a storage capacitor; b) an external voltage supplying unit for distributing an external voltage level fed from the outside thereof; c) an internal power supplying unit supplied with the external voltage level and producing an internal power voltage level lower than the external voltage level; d) a reference signal producing unit coupled to the internal power supplying unit for producing reference signals of a reference voltage level supplied to the storage capacitors of the rows of the memory cells, the reference voltage level being lower than the internal power voltage level; e) a plurality of word lines respectively coupled to the rows of the memory cells; f) a row address decoder unit responsive to a row address signal and driving one of the word lines for reading out the data bits from the memory cells coupled to the aforesaid one of the word lines; g) a plurality of bit line pairs respectively associated with the columns of the memory cells and propagating the data bits read out from the memory cells; h) a plurality of sense amplifier circuits coupled between a power supplying line and a discharging line and respectively associated with the bit line pairs, the plurality of sense amplifier circuits being activated in the presence of an activation signal for deciding the logic level of the data bits thereon; i) a plurality of transfer gate transistors coupled between the bit line pairs and the sense amplifier circuits and concurrently turning on in the presence of a transfer gate controlling signal for relaying the data bits on the bit line pairs to the sense amplifier circuits; and j) a timing controlling unit for producing the activation signal and the transfer gate controlling signal, in which the power supplying line is coupled to the external power supplying unit, and in which the timing controlling unit comprises a sense amplifier controller coupled to the external power supplying unit for producing the activation signal of the external power voltage level, and a transfer gate controller coupled to the internal power supplying unit for producing the transfer gate controlling signal shifted between a low voltage level, said internal power voltage level and a step-up voltage level higher than the internal power voltage level.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 5:
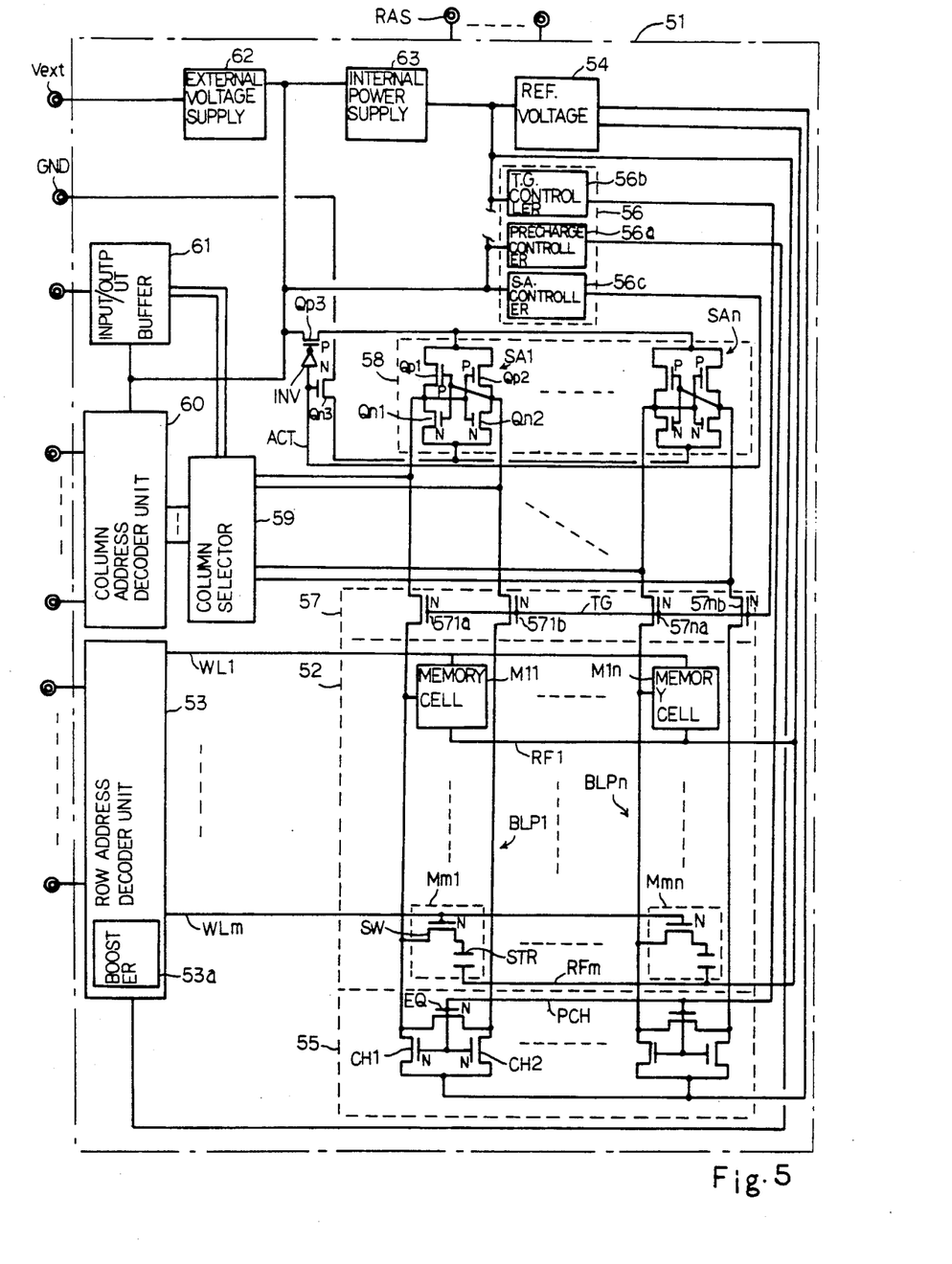
FIG. 5 is a block diagram showing a dynamic random access memory device according to the present invention.
Figure 6:
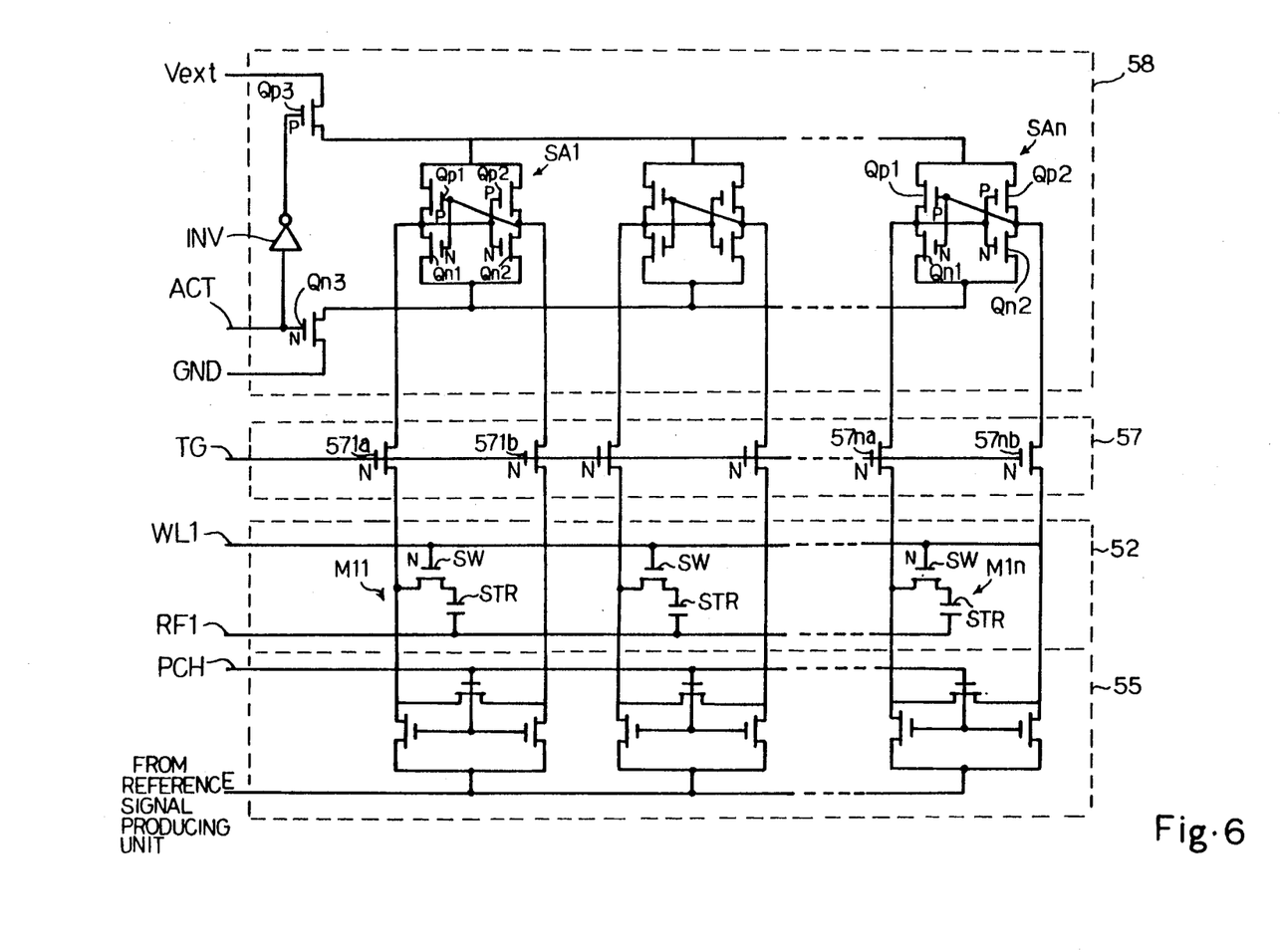
FIG. 6 is a circuit diagram showing the arrangement of a memory cell array accompanied with a precharging unit, a transfer gate unit and a sense amplifier unit incorporated in the random access memory device shown in FIG. 5.

Referring to FIGS. 5 and 6, a dynamic random access memory device embodying the present invention is fabricated on a signal silicon substrate 51. The random access memory device comprises a memory cell array 52, and the memory cell array 52 is fabricated from a plurality of memory cells M11, M1n, Mm1 and Mmn arranged in rows and columns. A plurality of first bit lines are, respectively, paired with a plurality of second bit lines so that bit line pairs BLP1 to BLPn are associated with the columns of the memory cells M11 to Mmn. Each of the memory cells M11 to Mmn is implemented by a series combination of a switching transistor SW of the n-channel type and a storage capacitor STR, and either the first or second bit line is coupled to the switching transistors incorporated in the associated row. The memory cell array 52 is further associated with a plurality of word lines WL1 to WLm, and the word lines WL1 to WLm are respectively coupled to the gate electrodes of the switching transistors SW of the rows. A row address decoder 53 is responsive to a row address signal, and a word line booster circuit 53a drives one of the word lines WL1 to WLm with a boosted voltage level Vh exceeding an internal power voltage level Vint. The boosted voltage level Vh is x times larger than the internal power voltage level Vint where x is greater than 1, and the internal power voltage level Vint is lower than an external power voltage level Vext fed from the outside of the random access memory device.

The memory cell array 52 is further associated with reference signal lines RF1 to RFm, and the storage capacitors STR incorporated in the rows of the memory cells M11 to Mmn are respectively coupled to the reference signal lines RF1 to RFm. The reference signal lines RF1 to RFm are driven by a reference signal producing unit 54, and the reference signals on the signal lines RF1 to RFm are selectively shifted to a reference voltage level VR. In this instance, the reference voltage level is a half of the internal power voltage level Vint.

A precharging unit 55 is provided for the bit line pairs BLP1 to BLPn, and the precharging unit 55 is fabricated from a plurality of precharging circuits each having two charging transistors CH1 and CH2 and an equalizing transistor EQ. The charging transistors CH1 and CH2 and the equalizing transistor EQ are of the n-channel type. The charging transistors CH1 and CH2 are coupled between the reference signal producing unit 54 and the first and second bit lines of the bit line pairs BLP1 to BLPn, and the gate electrodes of the charging and equalizing transistors CH1, CH2 and EQ are coupled to the precharging signal line PCH. The precharging signal line PCH is coupled to a precharging controller 56a of a controlling unit 56, and the precharging controller 56a is supplied with the external power voltage level Vext. This results in a precharging controlling signal of the external power voltage level Vext. The charging transistors CH1 and CH2 are supplied with the reference voltage level VR, and, accordingly, the first and second bit lines are precharged to the reference voltage level VR, i.e. a half of the internal power voltage level Vint, in the presence of the precharging controlling signal of the external power voltage level Vext.

The bit line pairs BLP1 to BLPn are further coupled to a transfer gate unit 57 which is fabricated from a plurality of n-channel type field effect transistor 57la, 57lb, 57na, and 57nb. The gate electrodes of the gate transistors 57la to 57nb are coupled through a transfer gate controlling signal line TG, and the transfer gate controlling signal line TG is driven to a step-up voltage level Vh' by a transfer gate controller 56b incorporated in the controlling unit 56. The transfer gate controlling signal line TG remains in the step-up voltage level for a predetermined time period and is, then, recovered to the internal power voltage level Vint. The step-up voltage level Vh' is a times larger than the internal power voltage level where a is greater than one. The step-up voltage level Vh' is selected in such a manner as to allow the voltage levels on the sense amplifier circuit SA1 to SAn to be fed back to the associated bit line pair during a predetermined time period without exceeding permitted voltage level. The permitted voltage level prevents the switching transistors SW from deterioration due to attack of hot carriers.

The transfer gate unit 57 is coupled to a sense amplifier unit 58 fabricated from a plurality of sense amplifier circuits SA1 to SA1 to SAn, and each of the sense amplifier circuits SA1 to SAn comprises two series combination of p-channel type field effect transistors QP1 and QP2 and n-channel type field effect transistors Qn1 and Qn2. The interconnections of each sense amplifier circuit is similar to that of the sense amplifier circuit incorporated in the prior art sense amplifier circuit, and, for this reason, no further description is incorporated hereinbelow.

The p-channel type field effect transistors Qp1 and Qp2 are supplied through a gate transistor Qp3 of the p-channel type with the external power voltage level Vext, and the n-channel type field effect transistors Qn1 and Qn2 are coupled through a gate transistor Qn3 of the n-channel type to a ground terminal GND. In other words, a low voltage level Vss close to the ground voltage level is supplied to the n-channel type field effect transistors Qn1 and Qn2. Each of gate electrodes of the gate transistors Qn3 is coupled to a sense amplifier controller 56c incorporated in the timing controlling unit 56, and the sense amplifier controller 56c is supplied with the external power voltage level Vext. For this reason, the sense amplifier controller 56c drives an activation signal line ACT to the external power voltage level Vext. The gate electrode of the gate transistor Qp3 is coupled through an inverter circuit INV to the activation signal line ACT, and, accordingly, both of the gate transistors Qp3 and Qn3 concurrently turn on and off in the presence of the activation signal on the signal line ACT. Although various timing controllers are incorporated in the controlling unit 56, the precharging controller 56a and the transfer gate controller 56b are shown in FIG. 5 for the sake of simplicity.

The sense amplifier circuits SA1 to SAn are coupled to a column selector 59, and a column address decoder unit 60 controls the column selector unit 59 in response to a column address signal. Namely, the column selector unit 59 provides a pair of signal paths between one of the sense amplifier circuits SA1 to SAn and an input-and-output buffer unit 61.

Figure 7:
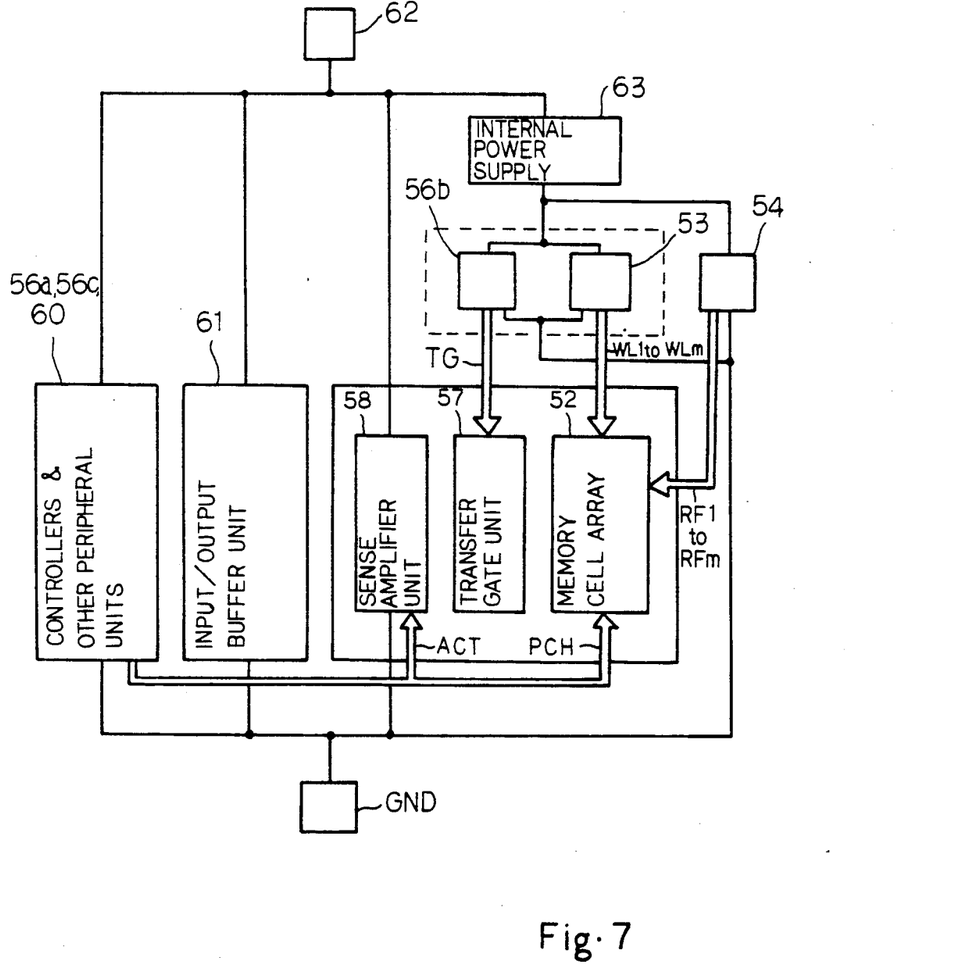
FIG. 7 is a block diagram showing the two-way power voltage system incorporated in the random access memory device according to the present invention.

The external power voltage level Vext is supplied from an external power source (not shown) to an external voltage supplying unit 62, and the external voltage supplying unit 62 distributes the external power voltage level Vext to controllers 56a and 56c, the sense amplifier unit 58, input-and-output buffer unit 61, other peripheral units such as the column address decoder unit 60, and an internal power supplying unit 63 as will be better seen from FIG. 7. The internal power voltage supplying unit 63 produces the internal power voltage level Vint lower than the external power voltage level Vext, and supplies the internal power voltage level Vint to the reference signal producing unit 54, the transfer gate controller 56b and the row address decoder unit 53. Thus, a two-way power voltage supplying system is incorporated in the random access memory device according to the present invention. In this instance, the external power voltage level Vext is of the order of 5 volts, and the internal power voltage level Vint ranges from 3.3 volts to 4.0 volts.

Figure 8:
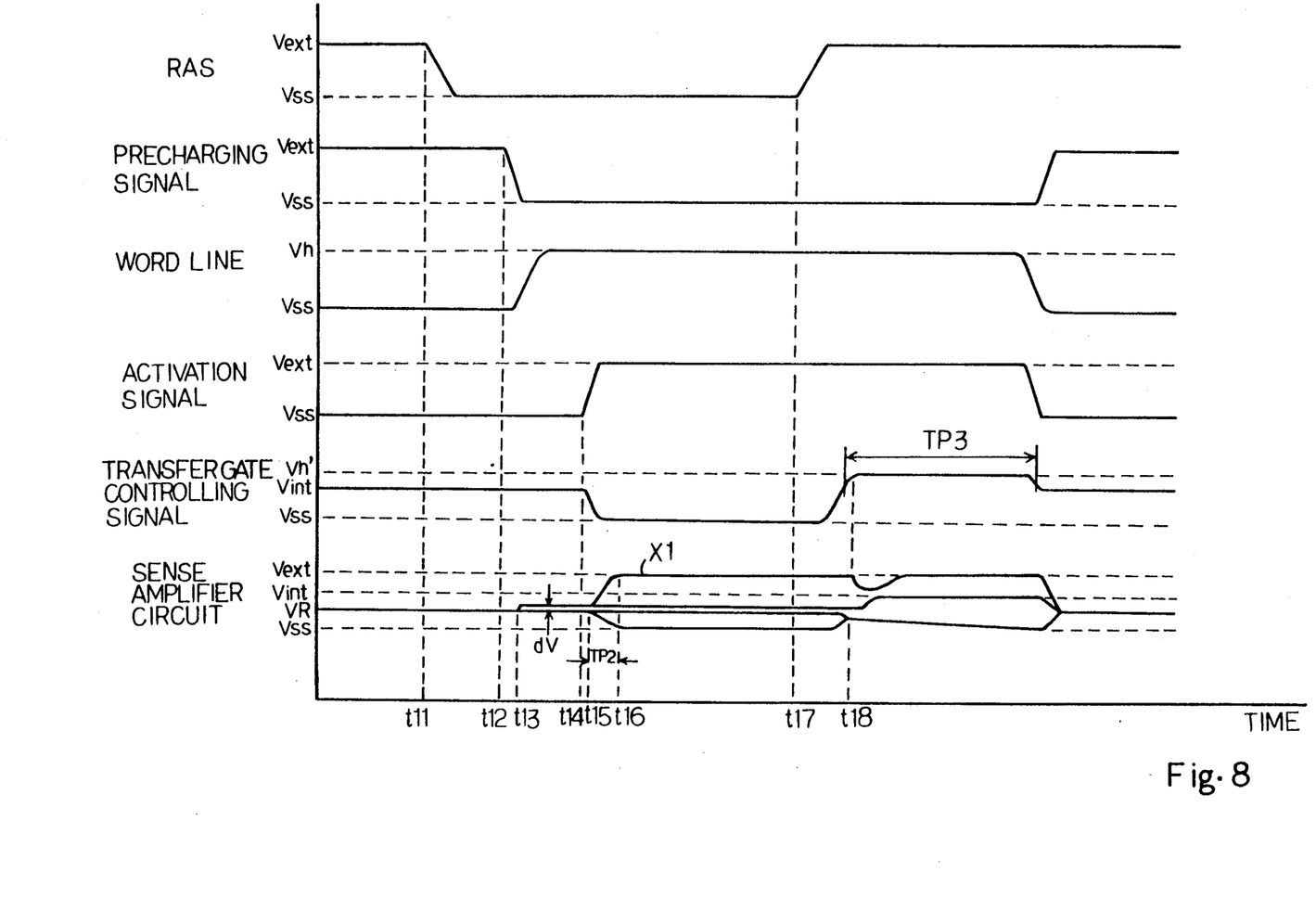
FIG. 8 is a timing chart showing the sequence of a read-out operation carried out by the dynamic random access memory device according to the present invention.

Description is made on the circuit behavior with reference to FIG. 8 on the assumption that the memory cell M11 with a data bit of logic "1" level is accessed. If a row address strobe signal RAS goes down to an active low voltage level or the low voltage level Vss at time t11, the precharging signal on the precharging signal line PCH is recovered to the low voltage level Vss at time t12, and the booster circuit 63a allows the word line WL1 to go up to the boosted voltage level Vh on the basis of a row address signal. Prior to the recovery of the precharging signal, the charging transistors CH1 and CH2 charge up all of the bit line pairs BLP1 to BLPn, and the equalizing transistors EQ each equalizes the component bit lines of the associated bit line pair. All of the bit line pairs BLP1 to BLPn are charged to the reference voltage level VR. The switching transistors SW coupled to the word line WL1 concurrently turn on, the data bits memorized in the storage capacitors STR are read out to the associated bit lines, respectively.

The associated bit line slightly goes up from the precharging level VR at time t13, and a pair of the gate transistors 571a and 571b allow a small difference dV between the increased voltage level and the precharging level VR to be relayed to the sense amplifier circuit SA1. At time t14, the transfer gate controlling signal TG is recovered from the internal power voltage level Vint to the low voltage level Vss, and the transfer gate unit 57 blocks the sense amplifier circuit SA1 from the parasitic capacitance of the associated bit line pair BLP1. The activation signal on the signal line ACT goes up to the external voltage level Vext and activates the sense amplifier circuits SA1 to SAn. The sense amplifier circuit SA1 starts to increase the small difference dV in voltage level on the bit line pair BLP1 at time t15, and the component bit lines of the bit line pair BLP1 reach the external power voltage level Vext and the low voltage level Vss, respectively, at time t16. Since the sense amplifier circuit SA1 is supplied with the external power voltage level Vext, the difference amplification is rapidly completed as will be understood from plots X1 of FIG. 8. The time period TP2 is surely shorter than the time period TP1 of FIG. 4. The column address decoder unit 60 causes the column selector 59 to transfer the voltage difference increased by the sense amplifier circuit SA1 to the input-and-output buffer unit 61.

The row address strobe signal RAS is recovered to the inactive level or the external power voltage level Vext at time t17, and the transfer gate controlling signal line TG goes up again, exceeding the internal power voltage level Vint to the step-up voltage level Vh' by the aid of a booster circuit incorporated in the transfer gate controller 56b. The transfer gate controlling signal reaches the step-up voltage level Vh' at time t18, then the gate transistors 571a to 57nb fully turn on for interconnecting the sense amplifier circuits SA 1 to SAn and the associated bit line pairs BLP1 to BLPn. Since the transfer gate controlling signal remains in the step-up voltage level for a predetermined time period TP3, the voltage differences increased by the sense amplifier circuits SA1 to SAn are fed back to the memory cell M11 to M1n for rewriting the data bits thereinto.

Second Embodiment

Figure 9:
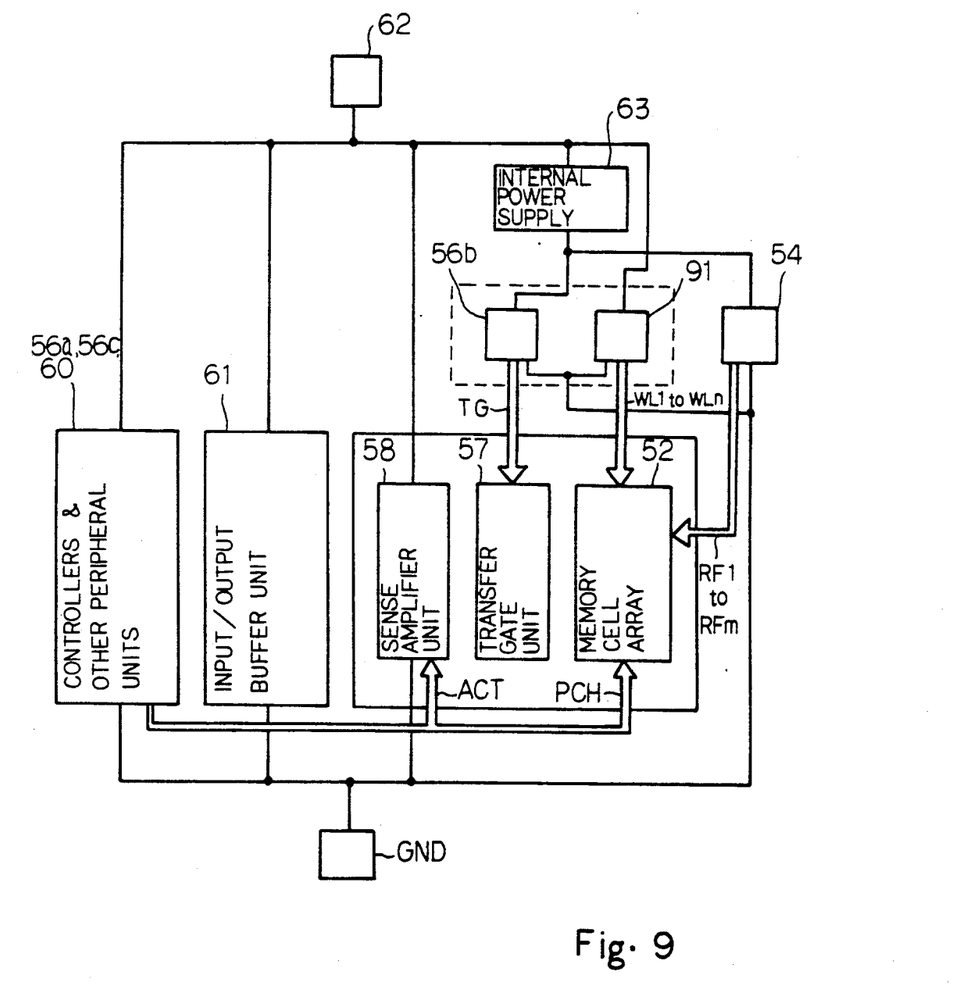
FIG. 9 is a block diagram showing the two-way power voltage system incorporated in another random access memory device according to the present invention.

Turning to FIG. 9 of the drawings, another two-way power supplying system is illustrated. The two-way power supplying system shown in FIG. 9 is incorporated in another random access memory device embodying the present invention, and a difference from the first embodiment is that the row address decoder unit 91 is supplied with the external power voltage level Vext from the external power supplying unit. However, other component units are similar to those of the first embodiment, and, for this reason, the other component units are designated by the same reference numerals and marks as the first embodiment.

In this instance, the external power voltage level Vext is about 5 volts, and the internal power voltage level Vint is about 3.3 volts. By virtue of the direct supply of the external power voltage level Vext, the current driving capability of the internal power supplying unit 63 is smaller than that of the first embodiment, because no boosting operation is carried out in the row address decoder circuit 91.

As will be understood from the foregoing description, the dynamic random access memory device according to the present invention drives the bit line pairs BLP1 to BLPn though the sense amplifier circuits SA1 to SAn with the external power voltage level Vext, the difference amplifications are rapidly completed, and the access speed is surely improved.

Although particular embodiments of the present invention have been shown and described, it will be obvious to those skilled in the art that various changes and modifications may be made without departing from the spirit and scope of the present invention.

What is claimed is:

1. A dynamic random access memory device fabricated on a semiconductor chip, comprising:
   a) a plurality of memory cells arranged in rows and columns and storing digital data bits, respectively, each of said memory cells being implemented by a series combination of a switching transistor and a storage capacitor;
   b) an external voltage supplying unit for distributing an external voltage level fed from the outside thereof;
   c) an internal power supplying unit supplied with said external voltage level and producing an internal power voltage level lower than said external voltage level;
   d) a reference signal producing unit coupled to said internal power supplying unit for producing reference signals of a reference voltage level supplied to said storage capacitors of the rows of said memory cells, said reference voltage level being lower than said internal power voltage level;
   e) a plurality of word lines respectively coupled to the rows of said memory cells;
   f) a row address decoder unit responsive to a row address signal and driving one of said word lines for reading out said data bits from said memory cells coupled to said one of said word lines;
   g) a plurality of bit line pairs respectively associated with the columns of said memory cells and propagating said data bits read out from said memory cells;
   h) a plurality of sense amplifier circuits coupled between a power supplying line and a discharging line and respectively associated with said bit line pairs, said plurality of sense amplifier circuits being activated in the presence of an activation signal for deciding the logic level of said data bits thereon;
   i) a plurality of transfer gate transistors coupled between said bit line pairs and said sense amplifier circuits and turning on in the presence of a transfer gate controlling signal for relaying said data bits on said bit line pairs to said sense amplifier circuits; and
   j) a timing controlling unit for producing said activation signal and said transfer gate controlling signal, in which said power supplying line is coupled to said external power supplying unit, and in which said timing controlling unit comprises a sense amplifier controller coupled to said external power supplying unit for producing said activation signal of said external power voltage level, and a transfer gate controller coupled to said internal power supplying unit for producing said transfer gate controlling signal shifted between a low voltage level, said internal power voltage level and a step-up voltage level higher than said internal power voltage level.

2. A dynamic random access memory device as set forth in claim 1, in which said internal power supplying unit supplies said internal power voltage level to a booster circuit associated with said row address decoder circuit for driving said one of said word lines higher than said internal power voltage level.

3. A dynamic random access memory device as set forth in claim 2, in which said random access memory device further comprises a precharging unit coupled between said reference signal producing unit and said bit line pairs for precharging said bit line pairs to said reference voltage level.

4. A dynamic random access memory device as set forth in claim 3, in which said reference voltage level is a half of said internal power voltage level.

5. A dynamic random access memory device as set forth in claim 1, in which said row address decoder unit is coupled to said external power voltage supplying unit for driving said one of said word lines to said external power voltage level.

* * * * *